United States Patent [19]

Ooga et al.

[11] Patent Number: 4,499,657
[45] Date of Patent: Feb. 19, 1985

[54] METHOD OF MAKING A SEMICONDUCTOR DEVICE HAVING PROTECTED EDGES

[75] Inventors: Hirotomo Ooga; Hiromi Sakurai, both of Itami, Japan

[73] Assignee: Mitsubishi Denki Kabushiki Kaisha, Tokyo, Japan

[21] Appl. No.: 404,051

[22] Filed: Aug. 2, 1982

Related U.S. Application Data

[63] Continuation of Ser. No. 125,866, Feb. 29, 1980, abandoned.

[30] Foreign Application Priority Data

Mar. 26, 1979 [JP] Japan .................. 54-37472

[51] Int. Cl.³ .............. H01L 21/20; H01L 29/04
[52] U.S. Cl. .................... 29/578; 29/576 E; 148/174; 148/175; 148/187; 148/188; 357/34; 357/36; 357/59
[58] Field of Search .............. 148/174, 175, 187, 188; 29/578, 576 E; 357/34, 36, 59

[56] References Cited

U.S. PATENT DOCUMENTS

| | | | |
|---|---|---|---|
| 3,189,973 | 6/1965 | Edwards et al. | 148/174 |
| 3,600,651 | 8/1971 | Duncan | 148/188 X |
| 3,607,466 | 9/1971 | Miyazaki | 148/174 X |
| 3,611,067 | 10/1971 | Oberlin et al. | 357/59 X |
| 4,036,672 | 7/1977 | Kobayashi | 148/174 X |

OTHER PUBLICATIONS

Sakai et al., "Elevated Electrode Integrated Circuits" IEEE Trans. Electron Dev., vol. ED-26, No. 4, Apr. 1979, pp. 379–385.
Okada et al., "New Polysilicon Process for Bipolar Device-PSA Technology" ibid, pp. 385–389.

*Primary Examiner*—William G. Saba
*Attorney, Agent, or Firm*—Wenderoth, Lind & Ponack

[57] ABSTRACT

An n⁻ silicon layer is epitaxially grown on an oxide film with predetermined openings disposed on one main face of an N+ silicon substrate to form single crystalline portions on the openings and polycrystalline portions on the oxide film. Ion implantation and thermal annealing is used to convert the polycrystalline portions to P+ external base regions and form P+ internal base regions in the single-crystalline portions. Arsenic ions are selectively implanted into the internal base regions to form n+ emitter regions. Then, base and emitter electrodes are formed on the external base and emitter regions to be electrically insulated from one another by an oxide film and a collector electrode is formed on the other main face of the substrate.

4 Claims, 19 Drawing Figures

METHOD OF MAKING A SEMICONDUCTOR DEVICE HAVING PROTECTED EDGES

This application is a continuation application of Ser. No. 125,866, filed Feb. 29, 1980, now abandoned.

BACKGROUND OF THE INVENTION

This invention relates to a semiconductor device and a process of manufacturing the same. Particularly, the invention concerns a high frequency high output bipolar transistor and a process of manufacturing such a transistor.

In order to increase the power gain of high frequency high output bipolar transistors at high frequencies, there have been previously proposed various means designed to decrease the base resistance thereof. For example, there have been already known a graft base structure including an active and an inactive base region, a structure including a emitter region encircled by a base region, a multi-emitter structure (which is also called a teeth of comb structure) having emitter stripes which are very narrow in width and others. Also, in order to decrease the capacitance of the base-to-collector junction, there has been previously proposed a measure of decreasing an impurity concentration of the particular semiconductor region toward which a depletion layer from the base-to-collector junction spreads.

In conventional bipolar transistors, as described above, the base-to-collector junction has extended substantially over the entire area of a semiconductor wafer involved, resulting in the disadvantage that the capacitance of the external base-to-collector junction is particularly large. Isoplanar silicon bipolar transistors, which are commercially available, have been improved with respect to this disadvantage by effecting the insulator width isolation of the inactive base region continuous to the base-to-collector junction through the utilization of the selective oxidization. However, the manufacturing of such transistors has included manufacturing steps which are complicated. Also, in their manufacturing, an erosion effect called "bird beak" might partly occur in the silicon of the transistors. This bird beak is apt to permit either end of the emitter region to extend over the mating base region to be connected to the collector region. Even though the emitter region would not be connected to the collector region, it has been difficult to control the base width.

Accordingly, it is the principal object of the present invention to eliminate the disadvantages of the prior art practice as described above by the provision of a semiconductor device capable of decreasing sharply the capacitance of a base-to-collector junction involved in a relatively easy manner and also of a process of manufacturing such a semiconductor device.

It is an object of the present invention to provide a semiconductor device designed and constructed so as to decrease sharply its base resistance and a process of manufacturing such a semiconductor device.

It is another object of the present invention to provide a process of manufacturing semiconductor devices which are consistently uniform with a good reproducibility.

SUMMARY OF THE INVENTION

According to one aspect thereof, the present invention provides a semiconductor device comprising a semiconductor substrate of a first conductivity type having a relatively high impurity concentration and including a pair of opposite main faces, an electrically insulating film disposed on one of the main faces of the semiconductor substrate to include a plurality of openings in a predetermined pattern thereon, a single-crystalline layer of the first conductivity type epitaxially grown on each of the openings and having a relatively low impurity concentration, an internal base region of a second conductivity type disposed on each of the single-crystalline layers, external base regions of the second conductivity type disposed on the electrically insulating film to be electrically connected to an adjacent one of the internal base region, an emitter region of the first conductivity type disposed on each of the internal base regions, a base electrode disposed in ohmic contact with each of the external base regions, an emitter electode disposed in ohmic contact with each of the emitter regions, and a collector electrode disposed in ohmic contact with the other main face of the semiconductor substrate.

According to another aspect thereof, the present invention provides a process of manufacturing a semiconductor device, comprising the steps of preparing a semiconductor substrate of a first conductivity type having a relatively high impurity concentration and including a pair of opposite main faces, disposing an electrically insulating film on one of the main faces of the semiconductor substrate to include a plurality of openings in a predetermined pattern thereon, epitaxially growing a semiconductor layer of the first conductivity type with a relatively low impurity concentration on the electrically insulating film including the openings to form a single-cystalline grown layer portion on each of the openings and polycrystalline grown layer portions on portions of the electrically insulating film including no opening respectively, doping the epitaxial grown layer with a second conductivity type imparting impurity to form an external base region of the second conductivity type in each of the polycrystalline grown layer portions to reach the electrically insulating film and also form an internal base region of the second conductivity type in each of the single-crystalline grown layer portions to be electrically connected to adjacent ones of the external base regions and form a pn junction therebetween, disposing an emitter region of the first conductivity type on each of the internal base regions to be shallower than the associated internal base region, and disposing a base electrode, an emitter electrode and a collector electrode in ohmic contact with each of the external base regions, each of the emitter regions and the other main face of the semiconductor substrate.

BRIEF DESCRIPTION OF THE DRAWINGS

The present invention will become more readily apparent from the following detailed description taken in conjunction with the accompanying drawings in which:

FIGS. 4a through 4c are views useful in explaining the advantages of the present invention, wherein FIG. 4a is a fragmental enlarged cross sectional view of a conventional bipolar transistor such as shown in FIG. 1g; FIG. 4b is a view similar to FIG. 4a but illustrating the present invention, and FIG. 4c is a graph illustrating the electric characteristic of the present invention as compared with that of the prior art practice.

DESCRIPTION OF THE PREFERRED EMBODIMENT

Referring now to FIG. 1 of the drawings, there is illustrated a process of manufacturing a conventional high frequency, high output silicon (Si) bipolar transistor designed so as to decrease its base resitance to thereby increase its power gain at high frequencies. In order to manufacture such a transistor, there has been first prepared an N+ type semiconductive silicon (Si) substrate 10 doped with a suitable N type-conductivity imparting impurity to an impurity concentration of about $10^{19}$ atoms per cubic centimeter as shown in FIG. 1a. That impurity is preferably small in auto-doping and may be antimony (Sb) or arsenic (As). As shown in FIG. 1b, an N− type epitaxially grown layer 12 is disposed on one of the main opposite faces, in this case, the upper main face as viewed in FIG. 1b of the substrate 10. The grown layer 12 has been doped with arsenic (As) or phosphorous (P) to a low impurity concentration of about $10^{16}$ atoms per cubic centimeter.

Figure 1A:
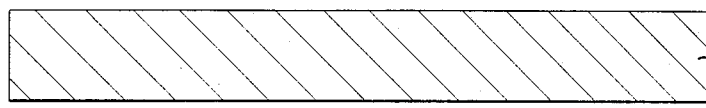
FIGS. 1a through 1g are cross sectional views of a conventional high frequency, high output bipolar transistor illustrated in the order of the fabrication steps thereof.
Figure 1B:
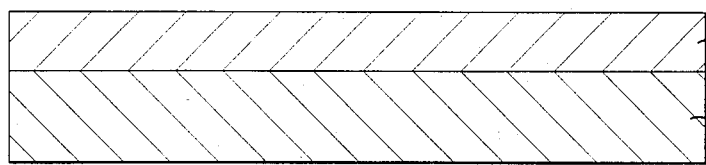
Figure 1C:
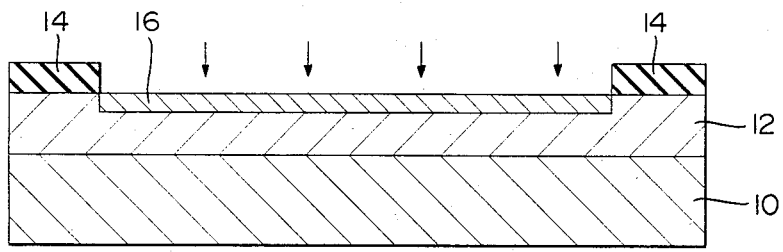

Then, the arrangement of FIG. 1b is oxidized to form an oxide film 14 on the grown layer 12 after which a predetermined portion of the oxide film 14 is removed in the manner well known in the art to expose that portion of the grown layer overlaid with the removed portion of the oxide film 14. Subsequently ions of boron (B) are implanted into the exposed surface of the grown layer 12 to an impurity concentration of about $5 \times 10^{18}$ atoms per cubic centimeter as shown at the arrows in FIG. 1c to form a boron implanted region 16 having a P+ type conductivity in the grown layer 12. This region 16 forms a base region at a later stage of fabrication.

Figure 1D:
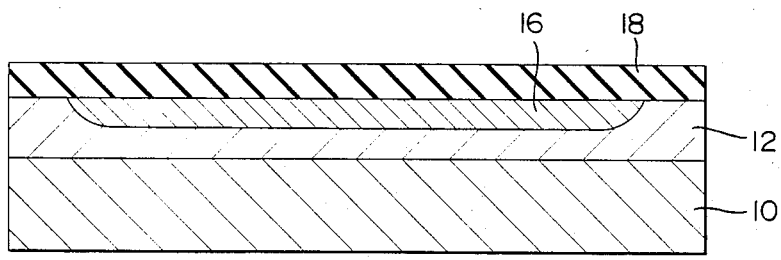

Following this, a CVD technique is used to form an oxide film 18 on the boron implanted region 16 to cover the latter and be connected to the remaining portion of the oxide layer 14. Then, an annealing is effected at an elevated temperature of about 1000° C. to remove damage to the region 16 caused by the ion implantation and also to make the CVD oxide film 18 more dense. The resulting structure is illustrated in FIG. 1d, wherein the oxide film 18 is shown as including the oxide film 14 as a part thereof and covering both the ion implanted region 16 and the grown layer 14.

In the example illustrated, the ions of boron have been implanted into the exposed surface portion of the grown layer 12 but boron may be deposited on the exposed surface portion followed by the driving of the boron into the grown layer 12 in an oxidizing atmosphere. However, the latter measure is disadvantageous in that the resulting base depth is apt to be irregular within the grown layer 12.

Figure 1E:
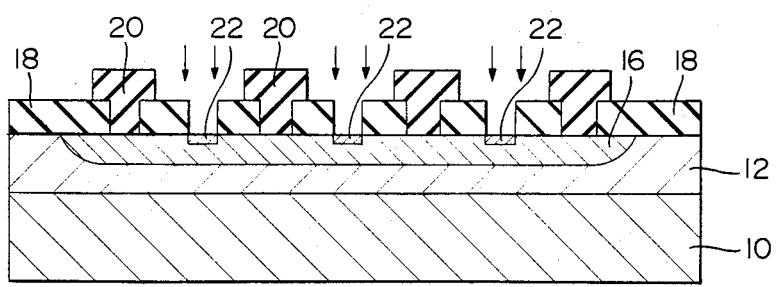

Subsequently, the CVD oxide film 18 is selectively etched to open windows for base contact or electrodes therein simultaneously with the formation of windows for emitter contactor electrodes to be arranged into a predetermined pattern (see FIG. 1e). Then, the windows for the base electrodes are filled with a photoresist 20 and ions of arsenic (As) are implanted only into regions 22 exposed to the windows for emitter electrodes to form N+ type emitter regions 22.

The step of implanting the ions of arsenic is important as far as the formation of a shallow emitter depth is concerned. Also, the simultaneous formation of the emitter and base windows significantly improves the accuracy of the photo lithography of a mask used for windows as compared with the formation of the emitter windows separately from the formation of the base windows. In other words, the step of simultaneously forming the emitter and base windows is most important for high frequency, high output bipolar transistors requiring an emitter stripe width on the order to from 0.5 to 2 μm.

Figure 1F:
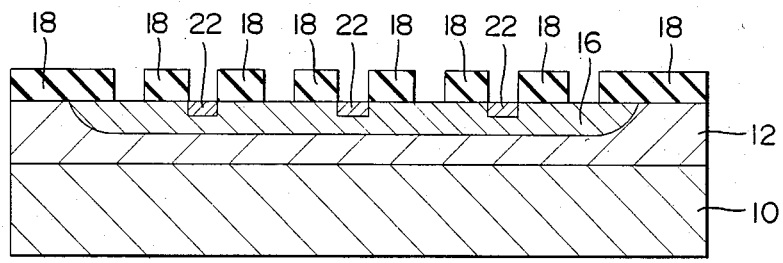

Then, the photoresist 20 filling each of the base windows is removed by utilizing plasma etching technique as shown in FIG. 1f and a heat treatment is effected to anneal the arrangement of FIG. 1f enough to remove damage to the emitter regions 22 caused by the implantation of the arsenic ions.

Figure 1G:
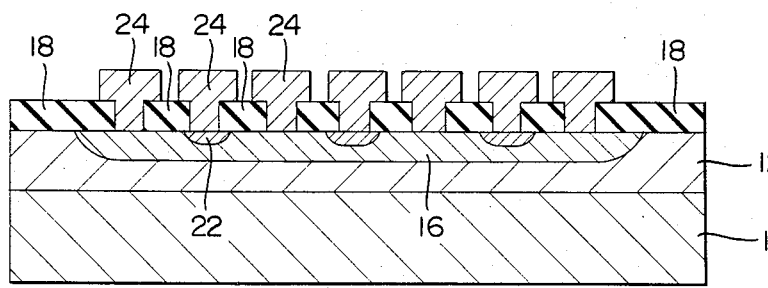

Following this, emitter and base electrodes 24 are disposed in ohmic contact with the emitter and base regions respectively as shown in FIG. 1g. At the same time, a collector electrode is disposed in ohmic contact with the other or lower main face of the semiconductor substrate 10 although the collector electrode is not shown only for purposes of illustration. This results in the completion of the high frequency, high output silicon bipolar transistor including an multi-emitter structure having a very small emitter stripe width.

For shallow junctions, the electrode is preferably of a composite type including a metallic material small in an alloyed amount and exhibiting a low resistance, a barrier metal and a highly conductive metallic material.

In addition, there have already been proposed various methods of decreasing the spacing between the emitter and base electrodes and decreasing the capacitance of a base-to-emitter junction, that of a base-to-collector junction and a base resistance by shrinking the transistor size enough to be attainable according to the existing photolithographic techniques.

In the arrangement as described above, the arsenic (As) has been used to form the emitter regions for the following reasons: the As implanted emitter region has a diffusion profile following a step function and is small in the emitter push out effect occurring when phosphorous (P) is utilized to form the emitter regions. This results in a decrease in each of the capacitance of the base-to-emitter junctions and a decrease in the base resistance.

In bipolar transistors of the type described above, how high the power gain can be held at high frequencies provides generally a measure of determining their performance. Between a maximum oscillation frequency $f_{max}$ and a power gain G there is generally held the relationship expressed by:

$$G = 20 \log (f_{max} \div f) \tag{1}$$

where f designates any frequency. Accordingly, in order to maximize the power gain G at a given frequency, it is required to make such a design that the maximum oscillation frequency $f_{max}$ is of a greatest magnitude at that frequency. In double diffusion type bipolar transistors, this maximum oscillation frequency $f_{max}$ fulfills the expression:

$$f_{max} = \sqrt{\frac{f_T}{8\pi(r_b + r_{eb})C_c}} \quad (2)$$

where $f_T$ designates the product of a common emitter gain multiplied by a bandwidth, $r_b$ a base resistance, $r_{eb}$ an emitter ballast resistance and $C_c$ designates a collector capacitance. Also, the base resistance $r_b$ may be expressed by:

$$r_b = r_{con} + r_b' + r_{bb}' \quad (3)$$

where $r_{con}$ designates a resistance of a base contact electrode, $r_b'$ an external base resistance or an inactive base resistance, and $r_{bb}'$ designates an internal base resistance or a resistance of an active base region disposed directly below an emitter region. Furthermore, the collector capacitance $C_c$ may be expressed by:

$$C_c = C_b' + C_{bb}' + C_{pad} \quad (4)$$

where $C_b'$ designates an external base-to-collector capacitance or the capacitance of the inactive base region, $C_{bb}'$ an internal base-to-collector capacitance or the capacitance of the active base region, and $C_{pad}$ designates an MOS capacitance developed between the semiconductor epitaxial layer and a pad.

Accordingly, in order to render the maximum oscillation frequency $f_{max}$ high, it is necessary to increase the current gain band width product $f_T$ and decrease $(r_b + r_{eb})C_c$. Furthermore, $f_T$ may be expressed by:

$$\frac{1}{f_T} = r_e(C_{Te} + C_c) + \frac{W_{b2}}{nD_{nb}} + r_{sc}C_c + \frac{X_m}{2V_{sc}} \quad (5)$$

where $r_e$ designates an emitter resistance for a forward bias, $C_{Te}$ a capacitance of a depletion layer spread between the emitter and base regions, $W_b$ a base width, $D_{nb}$ the mean diffusion coefficient of electrons in the base region, n a of electrons in the base region, $r_{sc}$ a series collector resistance, $X_m$ a width of a depletion layer spread between the collector and base regions, and $V_{sc}$ designates an electron velocity within the last-mentioned depletion layer. Furthermore, the density of electrons n may be expressed by:

$$n = \frac{\left(\ln \frac{N_{BE}}{N_{BC}}\right)^2}{\ln \frac{N_{BE}}{N_{BC}} - 1} \quad (6)$$

where $N_{BE}$ designates an acceptor concentration at an emitter-to-base junction, and $N_{BC}$ designates an acceptor concentration at a collector-to-base junction, while $l_n$ denotes the symbol for a Napierian logarithm.

Accordingly, bipolar transistors of the conventional construction have contemplated the improvement of the power gain by improvements due to the shrinking effected at present in the above expressions (2) and (5). Therefore, the existing improvements have reached such an extent that there is no room for further improvement without using further shrinking techniques. More specifically, by decreasing the emitter stripe width, it is normally contrived to reduce both the internal base resistance $r_{bb}'$ and the internal base-to-collector capacitance $C_{bb}'$ as described above. For example, if the emitter width of 2 μm decreases to 0.5 μm then the resistance $r_{bb}'$ and the capacitance $C_{bb}'$ can be quartered. At present, the emitter structure having an emitter stripe width on the order of 0.1 μm has be experimentally produced with the exposure with an electron beam or an X ray or the like but the safe level is of 0.5 μm on the basis of the mass production.

Also, in the prior art practice, the base-to-collector junction has been formed throughout the substantially entire area of the semiconductor wafer so that the capacitance $C_b'$ of the external base-to-collector junction has been particularly large. In order to reduce this capacitance of the external base-to-collector junction, the inactive base region for the collector-to-base junction might be partly cut by oxide films. For example, isoplanar bipolar transistors having the capacitance of the external base-to-collector junction thus reduced through selective oxidation are commercially available from Fairchild Camera and Instrument Corporation in the United States. However, manufacturing such transistors has required the steps of etching the nitride and silicon and so on. Those steps are complicated and, in addition, an erosion called a "bird beak" occurs on one portion of the particular silicon. The bird beak is apt to result in the occurrence of the so-called CE piping where the emitter region at either end extends over the mating base region to be connected to the associated collector region. Alternatively, even if the bird beak would not cause the CE piping, the control of the base width has been difficult. This has resulted in the provision of only bipolar transistors which are low in their collector-base breakdown voltage $V_{CBO}$ and low in their collector-emitter breakdown voltage $V_{CEO}$ because these voltages are limited by the emitter-to-base punch-through voltage.

The present invention contemplates the elimination of the disadvantages of the prior art practice as described above by the provision of a semiconductor device capable of sharply decreasing the capacitance of its collector-to-base junction in a relatively easy manner and of a process of manufacturing such a transistor.

Referring now to FIGS. 2a through 2h wherein like reference numerals of 100 series designate the components identical or corresponding to those shown in FIGS. 1a through 1g, there is illustrated one embodiment according to the semiconductor device of the present invention in the order of the fabrication steps thereof. A silicon (Si) substrate 110, highly doped with a suitable n type-conductivity imparting impurity, is oxidized to dispose an oxide film 114 on one of the opposite main faces, in this case, the upper main face thereof. Then, the oxide film 114 is selectively etched to form openings in a predetermined pattern therein to reach the upper main face of the substrate 110.

Figure 2A:
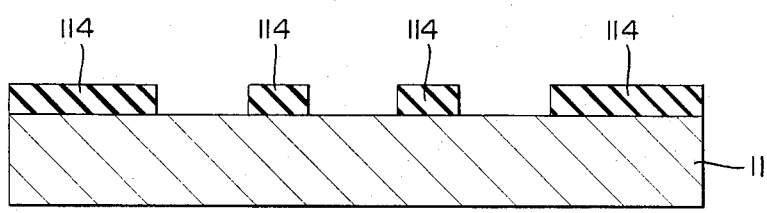
FIGS. 2a through 2h are cross sectional views of one embodiment according to the semiconductor device of the present invention illustrated in the order of the fabrication steps thereof.

The resulting structure is shown in FIG. 2a.

If desired, the oxide film 114 may be replaced by another electrically insulating film, for example, a nitride film.

Figure 2B:
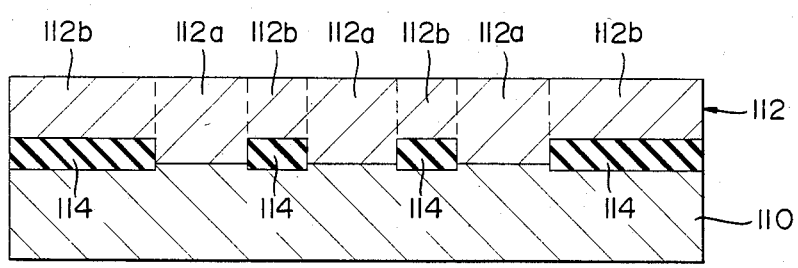

Then, a relatively lightly doped n type silicon (Si) is epitaxially grown on both the remaining portions of the oxide film 114 and the exposed portions of the upper main face of the substrate 110 or in and above the openings formed in the oxide film 114 to dispose an n⁻ type grown layer 112 on the side of the upper substrate face as shown in FIG. 2b. As shown in FIG. 2b, those portions 112a of the layer 112 grown in and above the abovementioned openings or on the exposed portions of the upper main face of the substrate 110 are of single crystalline silicon while those portions 112b of the layer 112 grown on the oxide film 114 are not of single crystalline silicon. That is, the portions 112b are polycrystalline silicon.

In the epitaxial growth, as described above, the grown layer portions 112a and 112b may have respective thicknesses varied at will by changing the conditions for the epitaxial growth.

Following this, the outer region of each of the outermost polycrystalline silicon portions 112b is removed by dry-etching silicon. This dry etching is uniformly effected over the whole surface area of the wafer because the outer region is underlaid with the adjacent portion of the oxide film 114.

Figure 2C:
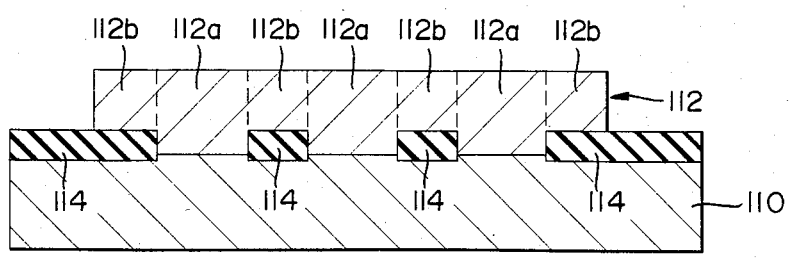

The resulting structure is shown in FIG. 2c.

In this dry etching, the thicknesses of the polycrystalline portion 112a and the singlecrystalline portion 112b may be varied at will through the utilization of the difference in etching rate between portions 112a and 112b.

Figure 2D:
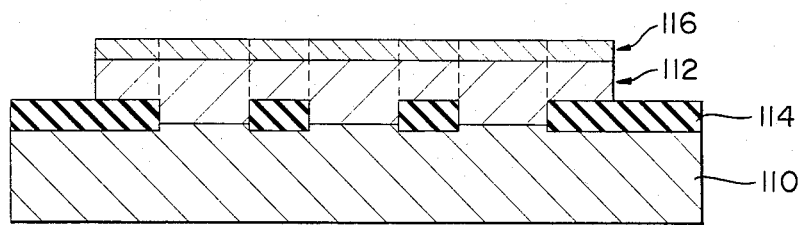

Then, ions of boron $B^+$ are implanted into the surface of the grown layer 112 to dispose a $P^+$ type region 116 thereon as shown in FIG. 2d. This region 116 forms a $P^+$ type base region.

In that state, the $P^+$ type base region 116 is subjected to thermal annealing. At that time, the boron has a very high diffusion coefficient in the polycrystalline portion 112b and therefore soon reaches that portion of the oxide film 114 overlaid with that portion 112b. Also, the diffusion proceeds toward each single crystalline portion 112a from a boundary between the latter and the adjacent polycrystalline portion 112b. On the other hand, the boron in the single crystalline portion line 112a is also diffused in the downward direction as viewed in FIG. 2d or toward the grown layer 112 but it is not so deeply diffused into the grown layer 112a because the boron has a diffusion coefficient equal to about one tenth that in the polycrystalline portion 112b. As a result, the single crystalline portion 112a disposed in and above each of the openings formed in the oxide film 114 is left to extend toward the upper surface of the $P^+$ type base region 116 from the periphery of the mating opening at a position somewhat less in level than the mouth thereof while being tapered until it terminates at a flat end surface to form a predetermined spacing between the same and the surface of the base region 116 as shown by the reference numeral 112 in FIG. 2e.

Figure 2E:
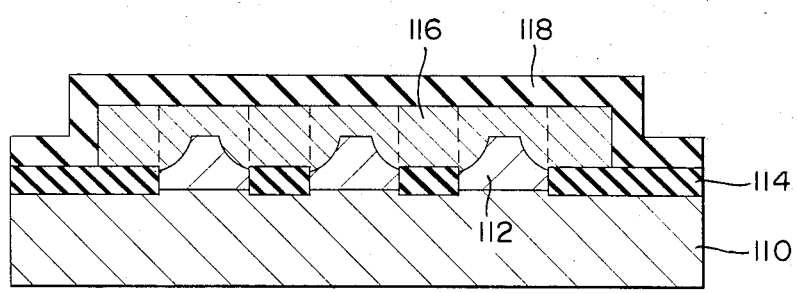

Then, thermal annealing is preferably effected in an atomsphere of nitrogen ($N_2$), helium (He) or argon (Ar) after the $P^+$ type base region 116 has been covered with an oxide film 118 deposited on the region 116 according the CVD technique (see FIG. 2e). This measure is effective for preventing a decrease in impurity surface concentration.

In this way, a $P^+$ type external base region has been formed in each of the polycrystalline portions 112b to reach the adjacent portion of the oxide film 114 while a $P^+$ type internal base region has been formed in each of the single crystalline portions 112a to include a shallow pn junction and be electrically connected to the adjacent $P^+$ type external base regions.

When the oxide film 118 thus formed is annealed at a temperature of from 1000° to 1100° C., the same is dense enought to increase an etching rate to about 1.2 times that of oxide films thermally formed.

Subsequently, the annealed CVD oxide film 118 is selectively etched to open therein windows for base and emitter contacts or electrodes in a predetermined pattern in which the windows are centrally located on the external and internal base regions and then only the windows for base electrodes are filled with a photoresist 120.

Figure 2F:
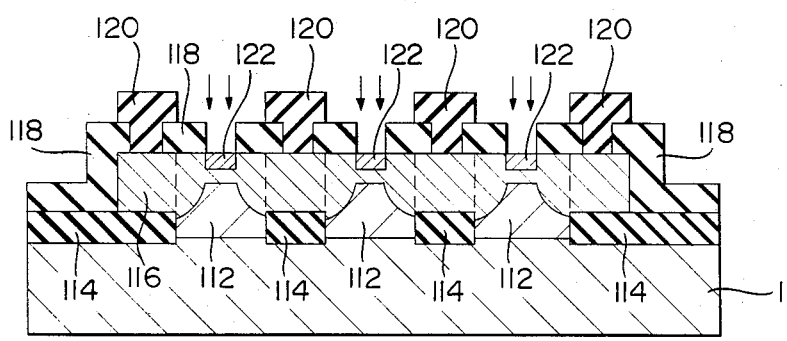

The resulting structure is shown in FIG. 2f.

Thereafter, ions of arsenic $As^+$ are implanted into the arrangement of FIG. 2f as shown by the arrows in FIG. 2f to dispose n+ type emitter regions 120 in the $P^+$ type base region 116 under the windows for the emitter electrodes to leave the base region 116 or an internal base region having a predetermined width with pn junctions formed therebetween, one for each emitter region.

Then, the arrangement of FIG. 2f is heat treated in a furnace after the photoresist 120 is removed from the arrangement. The heat treatment is effected for the purpose of removing damage to the silicon caused by the implantation of arsenic ions.

Figure 2G:
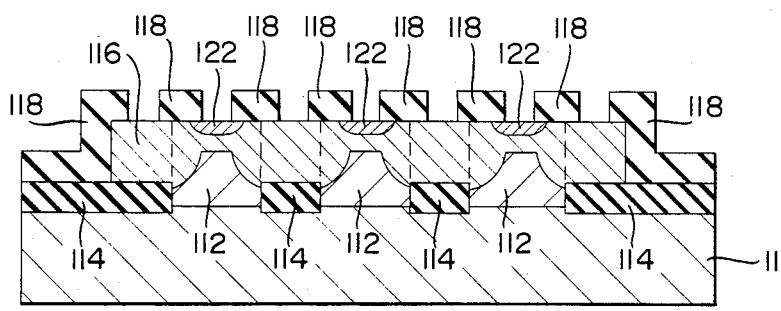

FIG. 2g shows the arrangement after the heat treatment.

Figure 2H:
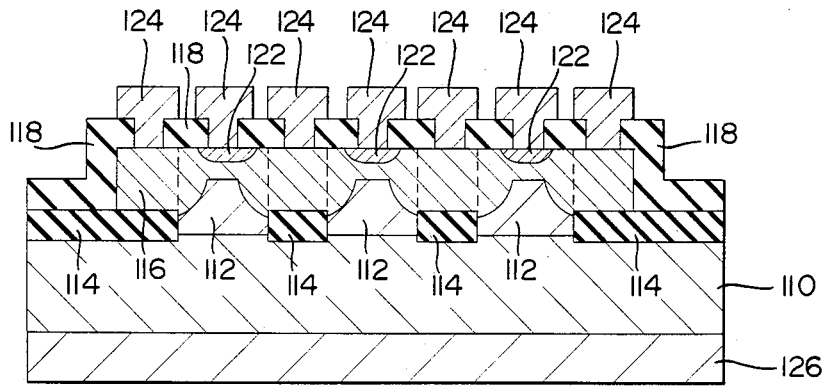

Finally, electrodes 124 are disposed in the windows to be in ohmic contact with the $P^+$ type base regions 116 and the n+ type emitter regions 122 respectively as shown in FIG. 2h. Simultaneously, a collector electrode 126 is disposed in ohmic contact with the other main face of the substrate 110. This results in the completion of a silicon bipolar transistor.

From the foregoing it is seen that the bipolar transistor of the present invention includes active regions disposed only in the single crystalline regions and includes polycrystalline regions into which no depletion layer spreads. Therefore, it is possible to dispose all pn junctions in single crystals having no crystal defect. Accordingly, the present invention is free from the problem that a leakage current is high with the pn junction disposed in a crystal which is not a single one. This results in very good junctions.

Figure 3:
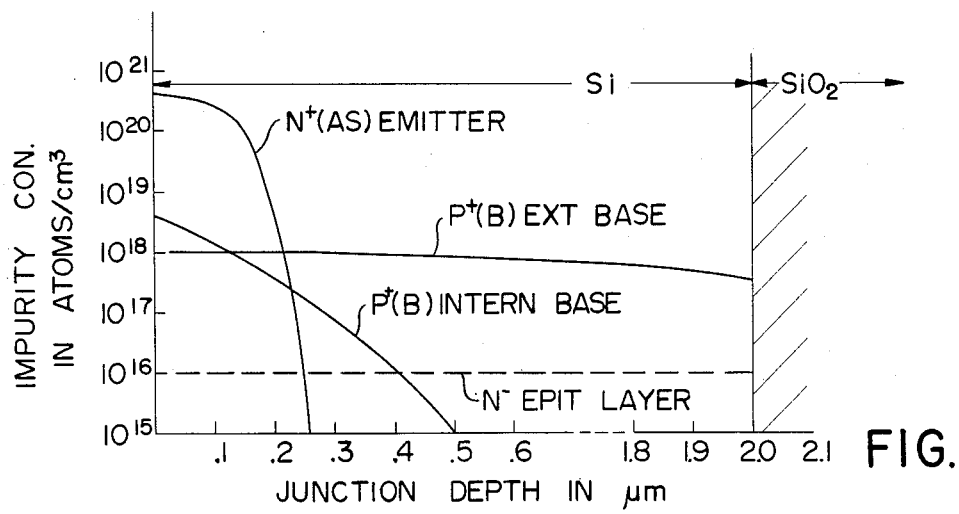
FIG. 3 is a graph illustrating profiles of impurity concentrations useful in explaining how high impurity concentrations are uniformly distributed in an inactive base region (or an external base region) according to the present invention.

In FIG. 3, wherein the ordinate represents an impurity concentration in atoms per cubic centimeter in a logarithmic scale and the abscissas represents a junction depth in $\mu$m, there are shown vertical profiles of impurity concentrations in the $P^+$ type base and $N^+$ type emitter regions included in bipolar transistors such as described above in conjunction with FIGS. 2a through 2h. The curve labelled "P+(B) INTERN BASE" depicts a vertical profile of the impurity (boron) concentration developed in an internal base region disposed directly under the $N^+$ type emitter region and formed of the single crystalline silicon. Also, the curve labelled "P+(B) EXT BASE" depicts a vertical profile of the impurity (boron) concentration developed in an external base region which is not disposed directly under the $N^+$ type emitter region and not formed of the single crystalline silicon. From curve P+ (B) EXT BASE, it is seen that the impurity, in this case, a high concentration of boron, is diffused into the external base region throughout the entire depth thereof, designated by Si in FIG. 3, until it reaches the hatched portion labelled $SiO_2$ which corresponds to the oxide film 114 overlaid with that external base region as shown in FIG. 2h. Thus the oxide film 114 serves to prevent a further diffusion of the impurity or boron.

Furthermore, in FIG. 3, the curve labelled $N^+$ (As) EMITTER describes a vertical profile of the impurity (arsenic) concentrations developed in the $N^+$ type emitter regions, such as shown by 122 in FIGS. 2g or 2h. Also, a dotted horizontal line designates an impurity concentration in an epitaxial grown layer such a shown by 112 in FIG. 2h.

In conventional bipolar transistors, such as described above in conjunction with FIGS. 1a through 1g, a vertical profile of the impurity concentrations similar to that shown by curve P+ (B) INTERN BASE has been developed in either of the internal and external base regions and the base resistance $r_b$ has been of a magnitudes determined by magnitudes of $r_{con}$, $r_b'$ and $r_{bb}'$ appearing on the righthand side of the expression (3) as described above.

In the present invention, a resistance corresponding to the external base resistance $r_b'$ can be decreased to about one tenth the conventional magnitude of the $r_b'$ because the impurity concentration in the external base region can be higher than that of conventional external base regions. Also, from the comparison of the collector capacitance $C_c$, it is seen that in the present invention, the external base-to-collector junction capacitance $C_b'$ appearing on the righthand side of the expression (4) may be reduced to about one half or one third the conventional magnitude. This is because the base-to-collector junction is separated into a plurality of discrete junction portions by split portions of the oxide film 114, although the internal base-to-collector junction capacitance remains unchanged. Furthermore, it is possible to improve the MOS capacitance $C_{pad}$ by thickening an underlaying oxide film, such as the oxide film 114. However, since an oxide film which is too thick may cause problems concerning cracks, for example, the present invention contemplates the improvement of $C_{pad}$ by only from 10 to 20% of the conventional magnitude.

Considering the thickness of the $n^-$ type epitaxially grown layer 112 or an $n^-$ type collector region, conventional bipolar transistors have included the collector region epitaxially grown to a thickness of about 2.4 $\mu$m. This thickness includes a thickness of 0.6 $\mu$m forming a base depth and the remaining thickness of 1.8 $\mu$m serving to hold the required reverse breakdown voltage across the collector and base regions. This voltage follows a well-known experimental expression:

$$V_{CEO} = \frac{V_{CBO}}{\sqrt[4]{h_{FE}}}$$

where $V_{CEO}$ designates a reverse breakdown voltage across a collector and an emitter region, $V_{CBO}$ a reverse breadown voltage across the collector and base regions, and $h_{FE}$ designates a current gain in the common emitter configuration. From the above expression, the current gain $h_{FE}$ of 100 could provide what had a $V_{CBO}$ of 35 volts and a $V_{CEO}$ of 11 volts. In this example, a difference between the $V_{CEO}$ and $V_{CBO}$ amounted at 24 volts. However, the required breakdown voltage is actually determined by the lower voltage or the $V_{CEO}$. In the conventional structure, the $V_{CBO}$ has been determined by the effect of a curvature exhibited by the periphery of the base with the result that the thickness of the $n^-$ type epitaxially grown layer has been larger than the necessary thickness.

In contrast, the present invention can be designed to render the $V_{CEO}$ substantially equal to the $V_{CBO}$. Accordingly, the $V_{CEO}$ is determined by the thickness of that portion of the $n^-$ type epitaxially grown layer disposed just under each of the emitter region but it does not depend upon the $V_{CBO}$. This means that the epitaxially grown layer 112 is required only to have a thickness on the order to 2.0 $\mu$m. Therefore, the resulting series collector resistance can be lowered.

In bipolar transistors including the collector region connected to external base regions through junctions formed therebetween, the operation performed therein does not quite reach the collector region. Accordingly, the base configuration according to the present invention is ideal. More specifically, conventional bipolar transistors have included the $n^-$ type collector layer extending to that region through which no collector current flows while that region which should be most utilized as the external base region has not been sufficiently employed. In contrast, the present invention has the $V_{CBO}$ as determined by that portion of the last-mentioned region connected to the thinest portion of the $n^-$ type collector layer. This is attained by controlling the thickness of the underlaying oxide film to determine a width of an associated deplation layer so that the $V_{CBO}$ is of 11 volts. As a result, the external base resistance $r_b'$ becomes extremely low while the series collector resistance is equal to about 0.78 time the conventional magnitude. In this way, the present invention has improved the base resistance $r_b$ appearing in the expression (2) and the collector capacitance $C_c$ and the series collector resistance $r_{sc}$ appearing in the expression (5). Accordingly, the present invention provides a semiconductor devide much improved in $r_b'$, $C_c$ $r_{sc}$.

Also, it has been found that the present invention is superior to the isoplanar structure as described previously. In the isoplanar structure, it has been difficult to control irregularity in the etching of silicon (Si) and internal strains occurring between the isolating oxide film and the nitride are apt to cause defects in the silicon (Si) included in the active silicon region. On the contrary, the present invention has no defect caused in the silicon involved because the polycrystalline portion of the base region absorbs internal stresses causing defects which are apt to occur in the silicon and such defects are not caused in the single crystalline portion thereof. Also, the present invention can simply decrease the capacitance of the collector-to-base junction without using a material such as nitride in which the internal stresses are easily generated.

Figure 4A:
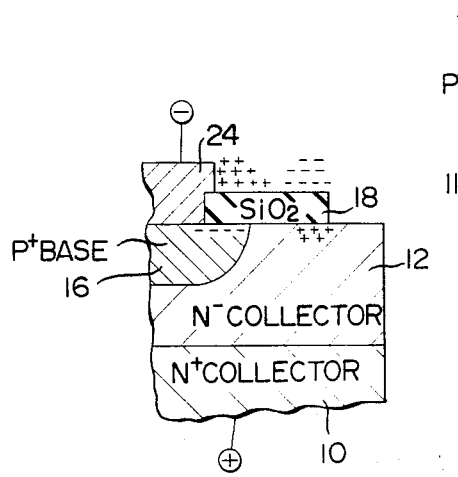

Furthermore, the present invention is advantageous in the reliability which will now be described with reference to FIGS. 4a, 4b and 4c. FIG. 4a shows in enlarged cross section that portion of a conventional base-to-collector junction located on a periphery of an associated semiconductor chip. Therefore, like reference numerals designate the components identical to those shown in FIG. 1g. The arrangement illustrated is normally operated with both a positive potential designated by the plus symbol encircled by a circle and applied to the n+ type substrate 10 in this case labelled N+ COLLECTOR and a negative potential designated by the minus symbol encircled by a circle and applied to the base electrode 24. Therefore, electric charges designated by the minus and plus symbols respectively are accumulated on the upper and lower surfaces as viewed in FIG. 4a of the oxide film 18 and labelled SiO, with respect to time. Therefore, if the P+ type base region 16, labelled P+ BASE, is low in its surface impurity concentration, then the surface thereof is inverted to an n type conductivity as shown by the minus symbol within the base region 16. Thus, the $I_{CBO}-V_{CBO}$ characteristic is such that a flow of channel current is caused as shown at curve a in FIG. 4c, wherein the $I_{CBO}$ is plotted on the ordinate against the $V_{CBO}$. Accordingly, even though the base region 16 is maintained so as to be sufficiently high in surface impurity concentration, that portion of the n⁻ type collector region 12 contacting the oxide film 18 and adjacent to a dicing line is apt to be inverted to a p type conductivity. Under these circumstances, the spread of a depletion layer causes a flow of channel current at and above a certain magnitude of the $V_{CBO}$, as shown at dotted curve c in FIG. 4c. This means that the prior art type bipolar transistors have been extremely unstable with respect to their reliability.

Figure 4B:
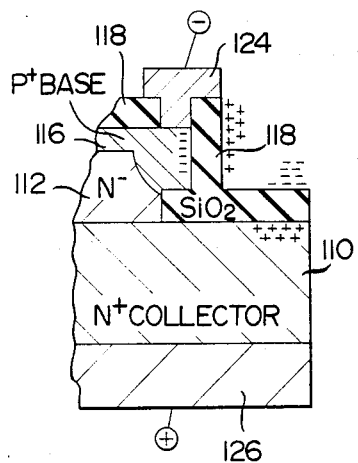
Figure 4C:
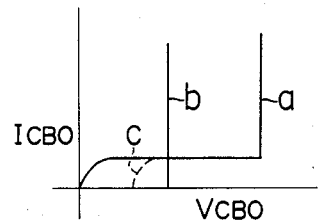

FIG. 4b is a view similar to FIG. 4a but illustrating the present invention. Therefore, like reference numerals designate the components identical to those shown in FIG. 2h. Even if that portion of the P+ type base region 116 adjacent to the oxide film 118 would form an inversion layer, as shown by the minus symbol denoted on the lefthand side or the inside as viewed in FIG. 4b of the oxide film 118, then no flow of channel current is caused because a region forming a base-to-collector junction is located on the inside of the oxide film 118. Furthermore, it is to be noted that in the present invention, the n+ type collector region is substituted for the conventional n⁻ type collector which has been apt to be partly inverted to the p type conductivity. Accordingly, there is no fear that an inversion will be caused. In other words, it has be previously required to render the passivation more perfect, whereas the present invention provides an extremely stable structure even with rendering the passivation not so perfect. Accordingly, the present invention can have a stable $I_{CBO} - V_{CBO}$ characteristic, as shown by curve b in FIG. 4c.

From the foregoing it is seen that the present invention provides high-frequency, high output bipolar tarnsistors having an extremely excellent performance and manufactured so as to be consistently uniform with good reproducibility.

While the present invention has been illustrated and described in conjunction with a single preferred embodiment thereof, it is to be understood that numerous changes and modifications may be resorted to without departing from the sprit and scope of the present invention.

What we claim is:

1. A process of manufacturing a semiconductor device having protected edges, said process comprising the steps of providing a semiconductor substrate of a first conductivity type having a relatively high impurity concentration and having a pair of opposite main faces, forming an electrically insulating film on one of the pair of main faces of said semiconductor substrate so as to include a plurality of openings in a predetermined pattern thereon, epitaxially growing a semiconductor layer with a relatively low impurity concentration on said electrically insulating film including said openings to form a single crystalline grown layer portion on each of said openings and polycrystalline grown layer portions on portions of said electrically insulating film including no opening respectively, doping said epitaxial grown layer with a second conductivity type imparting impurity so as to form an external base region of said second conductivity type in each of said polycrystalline grown layer portions to reach said electrically insulating film and so as to also form an internal base region of said second type conductivity in each of said single crystalline grown layer portions to be electrically connected to adjacent ones of said external base regions and so as to form a pn junction therebetween, wherein said internal base regions and said external base regions are formed through the utilization of a difference in their diffusion rates forming an emitter region of said first conductivity type on each of said internal base regions so as to be shallower than the associated internal base region, and forming a base electrode, an emitter electrode and a collector electrode in ohmic contact with each of said external base regions, each of said emitter regions and the other of the pair of main faces of said semiconductor substrate respectively, wherein said insulating film is formed so as to cover the edges of said internal base region or said external base region.

2. A process of manufacturing a semiconductor device as claimed in claim 1, wherein ions of said second conductivity type imparting impurity are implanted into said epitaxial grown layer to form a base region therein and then said base region is covered with a CVD oxide film after which thermal annealing is effected to form said internal and external base regions.

3. A process of manufacturing a semiconductor device as claimed in claim 1, wherein said polycrystalline regions of said epitaxial grown layer are formed so as to be thinner than said single crystalline region by etching said regions utilizing the fact that said polycrystalline regions have a higher etching rate than said single crystalline regions.

4. A process of manufacturing a semiconductor device as claimed in claim 1, wherein the polycrystalline regions of said epitaxially grown layer are formed so as to be thinner than said single crystalline regions.

* * * * *